United States Patent [19]

Kaplan et al.

[11] 4,259,430

[45] Mar. 31, 1981

[54] PHOTORESIST O-QUINONE DIAZIDE CONTAINING COMPOSITION AND RESIST MASK FORMATION PROCESS

[75] Inventors: Leon H. Kaplan, Yorktown Heights; Steven M. Zimmerman, Billings, both of N.Y.

[73] Assignee: International Business Machines Corporation, Armonk, N.Y.

[21] Appl. No.: 699,927

[22] Filed: Jun. 25, 1976

Related U.S. Application Data

[63] Continuation of Ser. No. 465,777, May 1, 1974, abandoned.

[51] Int. Cl.$^3$ .......................... G03C 1/54; G03C 5/00
[52] U.S. Cl. .................................. 430/191; 430/192; 430/317; 430/326; 430/330
[58] Field of Search ............ 96/91 D, 91 N, 91 R, 96/115 R, 115 P, 75, 33, 36, 36.3, 36.2; 430/191, 192, 326, 330

[56] References Cited

U.S. PATENT DOCUMENTS

| | | | |
|---|---|---|---|
| 2,892,712 | 6/1959 | Plambeck | 96/115 P |
| 3,188,210 | 6/1965 | Fritz et al. | 96/91 D |
| 3,201,239 | 8/1965 | Neugebauer et al. | 96/36.3 X |
| 3,459,708 | 8/1969 | Stevens | 260/59 |
| 3,495,979 | 2/1970 | Lavidon et al. | 96/33 |
| 3,551,154 | 12/1970 | Di Blas et al. | 96/91 D |
| 3,586,507 | 6/1971 | Barnett | 96/75 |
| 3,615,532 | 8/1971 | Silver | 96/91 D |
| 3,660,097 | 5/1972 | Mainthia | 96/91 D |
| 3,711,287 | 1/1973 | Dunham et al. | 96/115 R |
| 3,759,711 | 9/1973 | Rauner et al. | 96/91 D X |
| 3,782,939 | 1/1974 | Bonham et al. | 96/91 D X |
| 3,793,033 | 2/1974 | Mukherjee | 96/75 |
| 3,827,908 | 8/1974 | Johnson et al. | 96/91 D X |
| 3,900,325 | 8/1975 | Christensen et al. | 96/91 D |

OTHER PUBLICATIONS

Chemical Abstracts, vol. 71, 1969, #82121t.
Kirk-Othmar, "Encyclopedia of Chemical Technology", vol. 15, 2nd ed., 1968, pp. 188–190.

*Primary Examiner*—Charles L. Bowers, Jr
*Attorney, Agent, or Firm*—James R. McBride

[57] ABSTRACT

A resist composition includes an alkali soluble resin, a light sensitive diazo compound, and a thermally activated free radical initiator. Resist masks are formed from the above composition by providing a layer of resist on a substrate, exposing the layer patternwise to radiation, removing portions of the layer with a developing solution, and heating the remaining portions of the layer at a temperature which activates the initiator and cross-links the resist to improve the physical characteristics of the resist layer and minimize pattern distortion.

6 Claims, No Drawings

PHOTORESIST O-QUINONE DIAZIDE CONTAINING COMPOSITION AND RESIST MASK FORMATION PROCESS

This is a continuation of application Ser. No. 465,777 filed May 1, 1974, now abandoned.

BACKGROUND OF THE INVENTION

The formation of resist masks in the manufacture of integrated circuits using radiation sensitive layers which contain various organic polymers, such as alkali soluble resins, mixed with photosensitizers such as light sensitive diazo compounds is known. Layers of the light sensitive material are formed on a substrate, exposed to light or other activating radiation in a patternwise manner, and a visible image is developed by removing the more soluble portions of the layer with a developing solution. In order to improve the characteristics of the remaining portions of the resist layer, such as its adhesion to various substrates, or its resistance to chemical and/or thermal degradation, the pattern resist layer is conventionally baked at an elevated temperature. The thermoplastic polymer materials in the resist are subject to flow at temperatures above their second order glass transition temperatures. This tendency to flow distorts the resist pattern, and in the fine geometry patterns which are required, for example, in integrated circuit manufacture the distortion can result in dimensional changes or even the closing of fine lines. The baking, therefore, must be limited to temperatures below which flow would cause unacceptable pattern distortion.

BRIEF SUMMARY OF THE INVENTION

It has now been found that the addition of effective amounts of a thermally activated free radical forming initiator to the light sensitive resist composition minimizes pattern distortion due to resist flow when the resist layer is subjected to a heat treatment. The physical properties of the resist are also improved to provide better protection for the masked portions of the substrate during treatment with various materials and etchants.

In accordance with this invention a resist material is provided which comprises an alkali soluble resin, a light sensitive material, and a thermally activated free radical inititator.

A process for forming a resist mask comprises providing a layer of the resist on a substrate, exposing the layer patternwise to radiation, removing portions of the layer with a developer solution, and heating the remaining portions of the layer at a temperature which activates the initiator.

DETAILED DESCRIPTION

The foregoing and other objects, features and advantages of the invention will be apparent from the following preferred embodiments of the invention wherein parts are parts by weight unless otherwise indicated.

Examples of positive resist whose properties are improved by the invention are described, for example, in U.S. Pat. Nos. 3,046,118; 3,046,121; 3,106,465; 3,201,239 and 3,666,473 whose teachings are herein incorporated by reference. The resist compositions include light sensitive diazo materials such as napthoquinone-(1,2)-diazide sulfonic acid esters. Such materials can be represented by the formula:

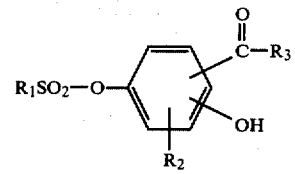

in which $R_1$ is a naphthoquinone-(1,2)-diazide radical, $R_2$ is selected from the group consisting of hydrogen and hydroxyl, and $R_3$ is selected from the group consisting of hydrogen, alkyl, aryl, alkoxy, aryloxy, amino, and heterocyclic groups. The sensitizers are mixed with a base soluble polymer such as novolak or resole resins which are prepared by reacting formaldehyde with a phenol in acid or basic solution. Examples of such resins would be phenol and cresol formaldehyde resins. The sensitizer to resin ratio is generally in the range of from about 1:1 to 1:6 by weight. The resist also may contain additional polymers and other materials such as adhesion promotors. It is believed that these resists operate by the formation of carboxyl groups in the light sensitive material under the influence of actinic radiation such that the exposed portions of the resist layer become more soluble in base.

The resists can be applied to substrates from solvent mixtures using conventional techniques such as spraying, flowing, rolling, spinning and dip coating after which the solvent is removed by evaporation to leave a layer of resist on the surface of the substrate. The solvent removal is sometimes aided by baking the layer at temperatures of around 100° C. The resist layer is exposed to radiation which will cause the sensitizer to react. Conventionally actinic light is used and more recently, various forms of high energy radiation such as x-ray and electron beam have been employed. The exposure takes place either through a pattern mask or by directing a shaped beam of radiation across the surface of the photosensitive resist layer. A pattern is developed in the layer to expose portions of the substrate by subjecting the layer to a developer solution which removes either the exposed or the unexposed areas of the resist. In normal processing using positive resists, a weakly basic developer solution is employed in order to remove the exposed areas. After development, the resist layer is usually postbaked in order to improve its physical properties and/or its adhesion to various substrates. Because the resist resins are normally thermoplastic when the baking is at temperatures above the second order glass transistion temperature, flow of the resin occurs. If higher temperatures are necessary in order to obtain the desired resist layer properties, the flow limits the ultimate resolution of the resist mask which can be achieved. Therefore, the baking temperature has heretofore been a compromise between the improvement in the properties of the resist layer which is desired and the maximum flow or distortion of the resist pattern which can be tolerated.

The composition and process of the invention meets these difficulties by adding to the resist an amount of a thermally activated, free radical producing initiator which will react upon heating to cause cross-linking so that the resist composition is resistant to flow before significant distortion of the pattern can occur. Not only is pattern distortion minimized but it is found that the initiator improves the resistance of the resist layer to various substrate treating solutions and temperatures to a degree which would previously require postbaking at prohibitively high temperatures.

Examples of thermal initiators which can be used in the process of the invention include acyl peroxides, for example benzoyl peroxide; peresters, for example t-butyl perbenzoate; hydroperoxides, for example t-butyl hydroperoxide and alkyl peroxides for example cumyl peroxide. Other free radical producing initiators such as azobisisobutyronitrile could also be employed. The particular initiator selected should be such that, at the chosen prebaking temperature, significant activation and free radical formation does not occur. This could result in undue interference with the speed of the resist during exposure. The amount of initiator added should be sufficient to reduce the flow under the conditions to which the resist layer is to be subjected. Amounts of initiator at a level of about 3 percent by weight based on the weight of resist solids give measurable improvement of flow resistance. Although amounts of about 30 percent by weight of initiator, based on resist solids can be employed, such amounts have been found to be unnecessary and may unduly interfere with resist speed and/or cause the polymer layer to become brittle. A preferred range is from about 6 to 15 percent by weight of initiator based, on resist solids, where the term "resist solids" includes the polymer and sensitizer portions of the resist. It has been found that amounts of initiator of about one percent by weight based on the weight of polymer in the resist are insufficient to obtain any benefit.

The advantages which are achievable by the process and composition of the invention are further illustrated by, but are not intended to be limited to, the following examples.

EXAMPLE 1

Samples of resist were prepared and coated onto thermally oxidized silicon wafers, having a 7,000 Å thick silicon oxide layer. The first photoresist comprised a meta-cresol formaldehyde novolac resin and a diazo ketone sensitizer which comprised mixed 2-diazo 1-oxo-napthalene-5-sulfonic acid esters of 2,3,4-trihydroxybenzophenone in a proportion of about 75 percent by weight polymer and 25 percent by weight sensitizer. The resist solids were coated from a solvent mixture of about 80 percent cellosolve acetate, 10 percent n-butyl acetate and 10 percent xylene. The solids content of the resist was about 31 percent by weight. The second sample of resist was the same as the first except that it contained about 0.3 percent by weight, on a liquid resist basis (about 1 percent of resist solids), of the thermal initiator, t-butyl hydroperoxide. The third resist sample was the same as the first except that it contained about 2.0 percent by weight, on a liquid resist basis (6 percent by weight of resist solids), of t-butyl hydroperoxide. Layers of resist were formed on the oxidized silicon wafers by spin coating at 6000 rpm followed by prebaking for 15 minutes at 85° C. The resist layers were then exposed to a resolution pattern containing various width line sets under exposure conditions to resolve 35 micro-inch lines. The exposed resist was removed by immersing the substrates in a conventional weakly alkaline developer solution which had a pH of about 13 and which comprised about a 5.0 percent by weight mixture of sodium metasilicate and sodium orthophosphate. The wafers were then baked by placing them in an oven heated at a temperature of about 170° C. for 30 minutes.

Five sites on each wafer were then examined to determine the smallest line set, in micro-inches, which was still open. Subsequently, the wafers were subjected to immersion in phosphoric acid heated at a temperature of 180° C. for 20 minutes and the effect of this environment on the resist layer was examined. Such a treatment would be typical of a silicon nitride etching process. Table I below shows the results for the three resist compositions used.

| | Smallest line set open (nominal") | | |
|---|---|---|---|
| | As Developed | As Baked | After H$_3$PO$_4$ |
| Unmodified Resist | | | |
| Site 1 | 35 | 50 | 70 (distortion) |
| 2 | 35 | 70 | 70 (distortion) |
| 3 | 35 | 70 | 90 (distortion) |
| 4 | 35 | 70 | 70 (distortion) |
| 5 | 35 | 70 | 70 (distortion) |
| Resist 0.3% t.B.H.P.* | | | |
| Site 1 | 35 | 70 | 70 (distortion) |
| 2 | 35 | 70 | 70 (distortion) |
| 3 | 35 | 70 | 70 (distortion) |
| 4 | 35 | 70 | 70 (distortion) |
| 5 | 35 | 70 | 70 (distortion) |
| Resist + 2.0% t.B.H.P* | | | |
| Site 1 | 35 | 35 | 35 |
| 2 | 35 | 35 | 35 |
| 3 | 35 | 35 | 50 |
| 4 | 35 | 35 | 35 |
| 5 | 35 | 35 | 50 |

*t.B.H.P. = tert. butyl hydroperoxide

The data show that the control sample with no peroxide flowed such that the smallest line set open after postbaking on four of the five sites was 70 micro-inches. The same result was achieved when employing peroxide at an 0.3 percent by weight of liquid resist. Also, after the first two compositions were subjected to hot phosphoric acid, the line patterns were distorted and no line sets smaller than 70 micro-inches remained open. In contrast, the third sample, containing about 2 percent by weight peroxide based on liquid resist, retained the 35 micro-inch open line sets after postbake, and the resist pattern withstood the hot phosphoric acid treatment with minimal effect.

EXAMPLE 2

The resistance to flow at various postbaking temperatures of samples containing different amounts of initiator are illustrated by this example. A benzoyl peroxide initiator was used and compared with control samples with respect to exposure time, developer time, and flow rating after postbake. Resist films having a thickness of about 8,000 Å were formed on freshly thermally oxidized silicon wafers having an oxide thickness of about 7,000 Å by spin coating liquid resist at a speed of about 3500 rpm. The resist was the same as that employed in Example 1 except that the resist solution was diluted to comprise three parts of resist solution to one part of additional solvent. Samples of the resist were modified by the addition of either 1, 5 or 10 percent by weight, based on liquid resist, of benzoyl peroxide. The resist coated wafers were prebaked for about 15 minutes at a temperature of about 90° C. and then exposed to a ultraviolet light source having an intensity of about 9 milliwatts per square centimeter over a wave length range of 4075 Å (±750 Å) for the times given in Table II below.

TABLE II

Properties of Benzoyl Peroxide Modified Films

| % Benzoyl peroxide in liquid resist | Exposure* time (sec.) | Developing time* (sec.) | Postbake** Temp. (°C.) | Flow*** rating microns | Etched Oxide edge slope |
|---|---|---|---|---|---|
| 0 | 7 | 30 | 150 | 1.3 | .82 |
| 1 | 7 | 60 | 150 | 1.0 | — |
| 10 | 7 | 120 | 150 | 0.8 | — |
| 5 | 7 | 35 | 150 | 0.8 | .95 |
| 5 | 10 | 50 | 160 | 0.8 | 1.09 |
| 0 | 7 | 60 | 160 | 1.6 | 0.68 |
| 5 | 10 | 50 | 168 | 1.0 | 1.22 |
| 0 | 7 | 60 | 168 | 1.6 | 0.82 |
| 5 | 10 | 50 | 180 | 0.8 | 1.22 |
| 0 | 7 | 60 | 180 | 1.6 | 0.95 |
| 5 | 10 | 50 | 190 | 1.0 | 1.50 |
| 0 | 7 | 60 | 190 | 2.0 | 1.22 |

*Constitutes exposure and development conditions necessary for good pattern.
**bake time 30 minutes.
***Smallest lineset remaining open after bake.

The exposure was through a test mask having sets of lines of different dimensions. The exposed resist layers were then developed in the alkaline developer for the times indicated in Table II. At benzoyl peroxide contents of 5 percent and above a slightly stronger alkaline developer solution was employed which contained sodium hydroxide and a small amount of surface active agent. The samples were then postbaked in an air oven at temperatures ranging from 150° to 190° C. Flow ratings were assigned depending upon the smallest line set remaining open after the postbake was completed. The oxide was then etched utilizing a 7 to 1 buffered HF solution for seven minutes. The resist films were stripped, using a conventional stripper which is a mixture of tetrachloroethylene, dichlorobenzene, phenol and a sodium alkyl napthalene sulfonate surfactant, at 90° C. for 15 minutes. As indicated from the results shown in Table II, the presence of the peroxide made the resist somewhat slower. However, at each postbake temperature a significant improvement in flow rating was obtained by the use of the peroxide initiator. An examination of the etched lines was made from photomicrographs of the etched samples taken at 1050× with thickness measurements performed with a tallystep to determine resist adhesion. These results indicated that for the conditions and substrate surface employed, higher amounts of peroxide and high postbaking temperatures may tend to degrade the adhesion of the resist which is probably due to excessive brittleness. These results indicate that amounts of peroxide which are unnecessary to impart the desired reduction in flow, or resistance to environmental conditions to which the resist layers will be subjected are preferably avoided.

EXAMPLE 3

Onto semiconductor wafers, from which it was desired to remove portions of a silicon nitride layer in hot phosphoric acid, was spin coated at 3500 rpm the resist solution prepared according to the 3 to 1 dilution in Example 2. The resist contained 2 percent by weight based on the weight of liquid resist of benzoyl peroxide. The resist layers were about 9,000 Å thick after baking for about 15 minutes at a temperature of about 90° C. The resist layers were exposed through a pattern mask for 10 seconds using the 9 milliwatt/cm² ultraviolet light source. The resist layers were developed to remove the exposed portions by immersing the wafers for one minute in dilute alkaline developer. The sample was postbaked at a temperature of about 200° C. for 20 minutes and the exposed portions of the silicon nitride layer were removed by etching in refluxing phosphoric acid at a temperature of about 160° C. After etching, the resist layer remained intact and it was stripped using hot $H_2SO_4$.

The foregoing has described a modified resist and resist mask process which permits the formation of resist masks having excellent chemical and thermal stability without sacrificing resolutions.

While the invention has been particularly shown and described with reference to preferred embodiments thereof it will be understood by those skilled in the art that the foregoing and other changes in form and details may be made therein without departing from the spirit and scope of the invention.

We claim:

1. A process for forming a positive resist mask comprising:

providing a layer which includes a mixture consisting essentially of an alkali soluble novolac or resole resin, a light sensitive diazo compound having the general formula;

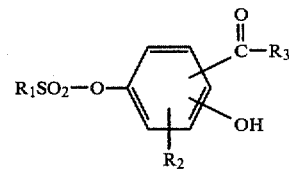

in which $R_1$ is a naphthoquinone-(1,2)-diazide radical, $R_2$ is selected from the group consisting of hydrogen and hydroxyl, and $R_3$ is selected from the group consisting of hydrogen, alkyl, aryl, alkoxy, amino and heterocyclic groups, and from about 3 to 30 percent by weight, based on the total weight of resist solids, of a thermally activated free radical initiator selected from the group consisting of acyl peroxides, peresters, hydroperoxides, alkyl peroxides, and azo-bis-(isobutyronitrile) on a substrate, exposing said layer patternwise to actinic radiation, removing the exposed portions of said layer with an alkaline developer solution, to form a resist pattern on said substrate and heating said resist pattern at a temperature above the second order glass transition temperature of said resin which activates said initiator to cross link said layer so as to inhibit flow of said resist pattern.

2. The process of claim 1 wherein said temperature is between about 150° and 200° C.

3. A process for forming a positive resist mask comprising providing a substrate with a layer of a photosensitive composition which includes a mixture consisting essentially of an alkali soluble novolac resin, a naphthoquinone-(1,2)-diazide sulfonic acid ester, and from about 3 to 30 percent by weight, based on the total weight of resist solids, of a thermally activated free radical forming initiator selected from the group consisting of acyl peroxides, peresters, hydroperoxides, alkyl peroxides, and azo-bis-(isobutyronitrile), exposing said layer patternwise to actinic radiation so as to react said diazo compound so as to render the exposed portion of said resist layer more soluble in base than the unexposed portion, removing the exposed portion of said layer with an alkaline developing solution, to form a resist pattern on said substrate and heating said resist pattern at a temperature above the second order glass transition temperature of said resin which activates said initiator to cross link said layer so as to inhibit flow of said resist pattern.

4. The process of claim 3 wherein said temperature is from about 150° to 200° C.

5. A positive-working photoresist composition consisting essentially of a mixture of an alkali soluble novolac or resole resin, a light sensitive diazo ketone having the general formula:

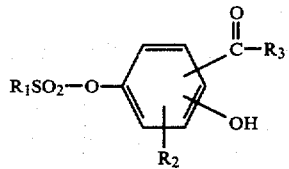

in which $R_1$ is a naphthoquinone-(1,2)-diazide radical, $R_2$ is selected from the group consisting of hydrogen and hydroxyl, and $R_3$ is selected from the group consisting of hydrogen, alkyl, aryl, alkoxy, aryloxy, amino and heterocyclic groups, and from about 3 to about 30 percent by weight, based on the total weight of resist solids, of a thermally activated free radical initiator selected from the group consisting of acyl peroxides, peresters, hydro peroxides, alkyl peroxides, and azo-bis-(isobutyronitrile).

6. The composition of claim 5 wherein the peroxide is present in an amount of from about 3 percent to about 15 percent by weight based on the total weight of resin and light sensitive compound.

* * * * *